United States Patent
Kuze

(10) Patent No.: US 11,422,189 B2
(45) Date of Patent: Aug. 23, 2022

(54) SWITCH AND ABNORMALITY DETERMINING METHOD THEREOF

(71) Applicant: TOYOTA JIDOSHA KABUSHIKI KAISHA, Toyota (JP)

(72) Inventor: Yasuhiro Kuze, Numazu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 72 days.

(21) Appl. No.: 17/074,691

(22) Filed: Oct. 20, 2020

(65) Prior Publication Data

US 2021/0181255 A1 Jun. 17, 2021

(30) Foreign Application Priority Data

Dec. 12, 2019 (JP) .............................. JP2019-224730

(51) Int. Cl.
*G01R 31/327* (2006.01)
*H01H 3/32* (2006.01)

(52) U.S. Cl.
CPC ........... *G01R 31/3277* (2013.01); *H01H 3/32* (2013.01)

(58) Field of Classification Search
CPC .............. G01R 31/327; G01R 31/3277; G01R 31/3278; G01R 31/3275; G01R 31/013; G01R 19/16509; H01H 3/32; H01H 45/00; H01H 47/14; H01H 47/16; H01H 47/18; H01H 3/3047; H01H 19/46; H01H 23/28; H01H 23/30; F16H 59/105; F16H 61/12
See application file for complete search history.

(56) References Cited

U.S. PATENT DOCUMENTS

| 4,916,263 | A | | 4/1990 | Ichigo |
| 5,287,005 | A | * | 2/1994 | Shinkawa .......... B60H 1/00835 200/1 V |
| 2002/0152827 | A1 | | 10/2002 | Hayashi et al. |
| 2005/0022621 | A1 | | 2/2005 | Kusano |
| 2005/0126322 | A1 | | 6/2005 | Kozaki et al. |
| 2014/0117971 | A1 | * | 5/2014 | Hokoi ................. F16H 61/0202 324/71.1 |

(Continued)

FOREIGN PATENT DOCUMENTS

| JP | H01-169825 A | 7/1989 |
| JP | 2002-254950 A | 9/2002 |
| JP | 2005-048887 A | 2/2005 |

(Continued)

*Primary Examiner* — Son T Le
(74) *Attorney, Agent, or Firm* — Oliff PLC

(57) ABSTRACT

A switch includes an operating member and three contacts (first, second and third contacts). The operating member displaces between a first and a second positions. A state of the three contacts is switched between a first and a second states by displacement of the operating member. Each contact connects or disconnects a signal line in the first state, and puts, in the second state, the signal line into a state reverse to the first stat. In course of the displacement of the operating member from the first position to the second position, the first contact switches from the first state to the second state, the second contact switches from the first state to the second state after switching of the first contact, and the third contact switches from the second state to the first state at a timing between switching of the first contact and switching of the second contact.

2 Claims, 14 Drawing Sheets

(56) References Cited

U.S. PATENT DOCUMENTS

2015/0144467 A1* 5/2015 Nikami ................. H01H 15/10
200/16 R
2016/0300670 A1 10/2016 Ataka

FOREIGN PATENT DOCUMENTS

JP        2005-172118 A    6/2005
JP        2016-201302 A    12/2016

* cited by examiner

SWITCH AND ABNORMALITY DETERMINING METHOD THEREOF

CROSS-REFERENCE TO RELATED APPLICATION

The present application claims priority under 35 U.S.C. § 119 to Japanese Patent Application No. 2019-224730, filed Dec. 12, 2019. The contents of this application are incorporated herein by reference in their entirety.

TECHNICAL FIELD

An example of the present disclosure relates to a switch or an abnormality determining method thereof.

BACKGROUND

For example, as described in JP2002-254950A, a switch is used in an input device of a control system of a vehicle such as a shift device.

Some switches used in the control system of the vehicle have a plurality of signal lines to ensure redundancy. Each signal line is provided with a contact which is actuated by operation of the switch. Each contact is connected or disconnected by on-operation or off-operation of the switch. By a combination of signals obtained from each signal line, it is detected that the on-operation or off-operation is performed on the switch. Further, in such a switch, the occurrence of disconnection or short-circuit is detected from the combination of signals.

However, depending on the structure of the switch, especially the structure of the contact, an abnormality may be erroneously detected even when no abnormality has occurred.

SUMMARY

It is an object of an example in the present disclosure to provide a switch for physically suppressing erroneous detection of an abnormality. It is another object of an example in the present disclosure to provide an abnormality determination method for accuracy determining an abnormality occurring in the switch.

A switch according to an example in the present disclosure includes an operating member for displacing between a first position and a second position, and three contacts. A state of the three contacts is switched between a first state and a second state by the displacement of the operating member. Each contact connects or disconnects a signal line in the first state, and puts, in the second state, the signal line into a state reverse to the first state. A first contact of the three contacts is configured to switch from the first state to the second state in the course of the displacement of the operating member from the first position to the second position. A second contact of the three contacts is configured to switch, in the course of the displacement of the operation member from the first position to the second position, from the first state to the second state at a timing later than the timing of the switching of the first contact. A third contact of the three contacts is configured to switch, in the course of the displacement of the operating member from the first position to the second position, from the second state to the first state at a timing later than the switching of the first contact and earlier than the switching of the second contact.

An abnormality determining method of the switch according to another example in the present disclosure is a method for determining an abnormality occurring in the switch having the above-described configuration. Two examples of the methods are as follows:

In a first method, when all of a first signal output from the first contact, a second signal output from the second contact, and a third signal output from the third contact are signals corresponding to the first state, when the first signal and the second signal are switched to signals corresponding to the second state, and if only the third signal is maintained as a signal corresponding to the first state, it is determined that an abnormality in which the third contact is fixed in the first state occurs.

In a second method, when all of the first signal output from the first contact, the second signal output from the second contact, and the third signal output from the third contact are signals corresponding to the second state, and when the first signal and the second signal are switched to signals corresponding to the first state, if only the third signal is maintained as a signal corresponding to the second state, it is determined that an abnormality in which the third contact is fixed in the second state occurs.

In the switch according to the example in the present disclosure, if no abnormality occurs on any of the three contacts, and when the operating member is in the first position, the first and the second contacts are in the first state whereas the third contact is in the second state. When no abnormality occurs on any of the three contacts, and when the operating member is in the second position, the first and the second contacts are in the second state, whereas the third contact is in the first state. Then, when no abnormality occurs on any of the three contacts, during the process of displacing the operating member from the first position to the second position, not all the contacts becomes the first state, and also, not all the contacts becomes the second state. Therefore, all the contacts are in the same state only when an abnormality occurs in the switch. As described above, according to the switch of the example in the present disclosure, it may be possible to physically suppress erroneous detection of an abnormality.

According to the abnormality determining method of the switch according to the example in the present disclosure, when all the signals are a signal corresponding to the second state, based on the subsequent combination of the signals, it may be possible to correctly determine that an abnormality in which the third contact is fixed in the first state occurs. Also, when all the signals are a signal corresponding to the first state, based on the subsequent combination of the signals, it may be possible to correctly determine that an abnormality in which the third contact is fixed in the second state occurs.

DESCRIPTION OF EMBODIMENTS

Embodiments in the present disclosure will be described with reference to drawings. Even if numerical values of each element, such as the number, quantity, amount, and range, are described in the embodiment, the embodiment in the present disclosure is not limited to the numerical values unless explicitly stated or the numerical values are clearly specified in principle. In addition, the structure, steps, and the like described in the embodiments described below are not necessarily essential to the present invention unless otherwise specified or clearly specified in principle.

1. First Embodiment

Figure 1:
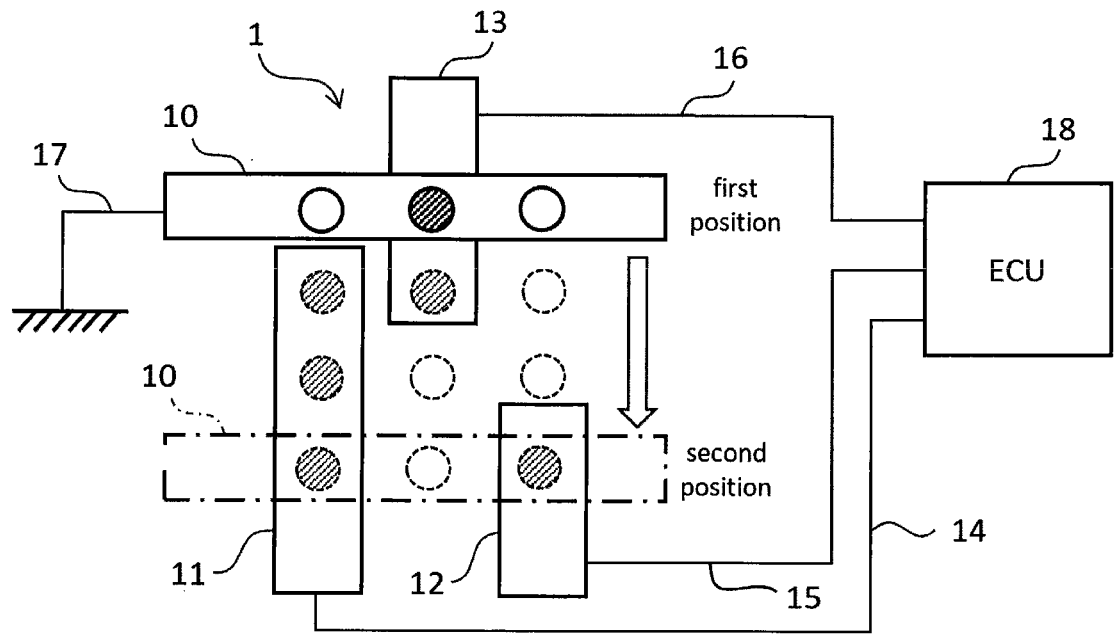
FIG. 1 is a diagram illustrating a schematic configuration of a switch according to a first embodiment in the present disclosure.

A schematic configuration of a switch 1 according to a first embodiment of the present disclosure is illustrated in FIG. 1. The switch 1 is a sliding contact type switch comprising three fixed terminals 11, 12, 13 and one movable terminal 10 which functions as an operation member. Signal lines 14, 15, 16 are respectively connected with the fixed terminals 11, 12, 13. Ground wire 17 is connected with the movable terminal 10. The fixed terminals 11, 12, 13 are configured by including a first fixed terminal 11, a second fixed terminal 12 and a third fixed terminal 13. The first terminal 11 constitutes a normally open contact with the movable terminal 10. The second fixed terminal 12 constitutes a normally open contact with the movable terminal 10. The third fixed terminal 13 constitutes a normally closed contact with the movable terminal 10. That is, the switch 1 is configured as an inverted three-triple switch.

In this specification, normally open is denoted as "NO", and normally closed is denoted as "NC". When the fixed terminals 11, 12 and 13 are individually referred to, the first fixed terminal 11 constituting the NO contact (hereinafter, referred to as a "1st NO contact") as a first contact is referred to as a 1st NO terminal. The second fixed terminal 12 constituting the NO contact (hereinafter, referred to as a "second 2nd NO contact") as a second contact is referred to as a "2nd NO terminal". The third fixed terminal 13 constituting the NC contact as a third contact is referred to as an "NC terminal".

Movable terminal 10 slides on the fixed terminals 11, 12 and 13 in a range from a first position illustrated by a solid line in FIG. 1 to a second position illustrated by a chain line. In FIG. 1, black circles denote a state in which the contacts are closed whereas white circles denote a state in which the contacts are open. In the first position, the movable terminal 10 is in contact with only the NC terminal 13. Therefore, in the first position, the NC contact is closed and the 1st NO contact and 2nd NO contact are open. This state is an OFF-state as a first state of the switch 1.

When the movable terminal 10 is moved toward the second position, then the movable terminal 10 also contacts with the 1st NO terminal 11. Thus, the NC contact and 1st NO contact are closed and only the 2nd NO contact is open. When the movable terminal 10 is moved further in the direction of the second position, the contact of the movable terminal 10 with the NC terminal 13 is released and the movable terminal 10 contacts only with the 1st NO terminal 11. Thus, the NC contact and 2nd NO contact are open and only the 1st NO contact is closed.

When the movable terminal 10 is moved further in the direction of the second position and the movable terminal 10 arrives at the second position, the movable terminal 10 is in contact with the 1st NO terminal 11 and 2nd NO terminal 12. Thus, in the second position, 1st NO and 2nd NO contacts are closed and the NC contact is open. This state is an ON-state as a second state of the switch 1.

As described above, the fixed terminals 11, 12, 13 are arranged so that one or two of the fixed terminals 11, 12, 13 contact with the movable terminal 10 when the movable terminal 10 slides in the range from the first position to the second position. That is, the fixed terminals 11, 12, 13 are arranged so that the movable terminal 10 does not come into contact with all of the fixed terminals 11, 12, 13 at the same time and comes into contact with at least one of the fixed terminals 11, 12, 13 until the switch 1 is switched from the OFF-state to the ON-state.

The signal lines 14, 15, 16 extending from the respective contacts are connected to an ECU18. The signal line 14 transmits a signal (first signal) from the 1st NO contact, the signal line 15 transmits a signal (second signal) from the 2nd contact, and the signal line 16 transmits a signal (third signal) from the NC contact. An OFF signal is output to the ECU18 from the contact in the open state, and an ON signal is output to the ECU18 from the contact in the closed state. The ECU18 determines operation performed on the switch 1 based on the combination of the signals from the signal lines 14, 15, and 16. When the combination of signals of the signal lines 14, 15, and 16 is turned ON, ON, and OFF, the ECU18 determines that an ON operation is performed on the switch 1. When the combination signal of the signal lines 14, 15, 16 is turned OFF, OFF, and ON, the ECU18 determines that an OFF operation is performed on the switch 1.

The ECU 18 is, for example, an ECU of a shifting device of a vehicle. Switches of the inverting triple system, such as the switch 1, are suitable for use in applications requiring reliability, for example, a shift switch or IG switch of the vehicle. When the switch 1 is applied to the shift switch, the switch 1 is provided for each range, such as P, R, N, D, and B. Switching processing to each range is assigned to the on-operation for the switch 1.

According to the switch 1 configured as described above, when no abnormality occurs on any of the three contacts and when the movable terminal 10 which is an operating member is in the first position, the 1st NO contact and 2nd NO contact are in the open state and the NC contact is in the closed state. Further, when no abnormality occurs on any of the three contacts and when the movable terminal 10 is in the second position, the 1st NO contact and 2nd NO contact are in the closed state, and the NC contact is in the open state. Then, when no abnormality occurs on any of the three contacts, in the course of displacing the movable terminal 10 from the first position to the second position, not all the contacts are in the open state, and also, not all the contacts are in the closed state.

That is, according to the configuration of the switch 1, all of the 1st NO contact, the 2nd NO contact and the NC contact are in the open state only when an abnormality occurs in the switch 1. Similarly, all of these contacts are in the closed state only when an abnormality occurs in the switch 1. As will be described in detail later, if a switch is configured to pass through a state in which all the contacts are in the same state in the course of the on-operation or the off-operation, it is not possible to immediately determine whether or not the fact that all the contacts are in the same state is due to an abnormality of the contacts, such as an off-fixation and an on-fixation. However, according to the switch 1 configured as described above, since not all the contacts are in the same state if they are normal, it may be possible to physically suppress erroneous detection of an abnormality.

Figure 2:
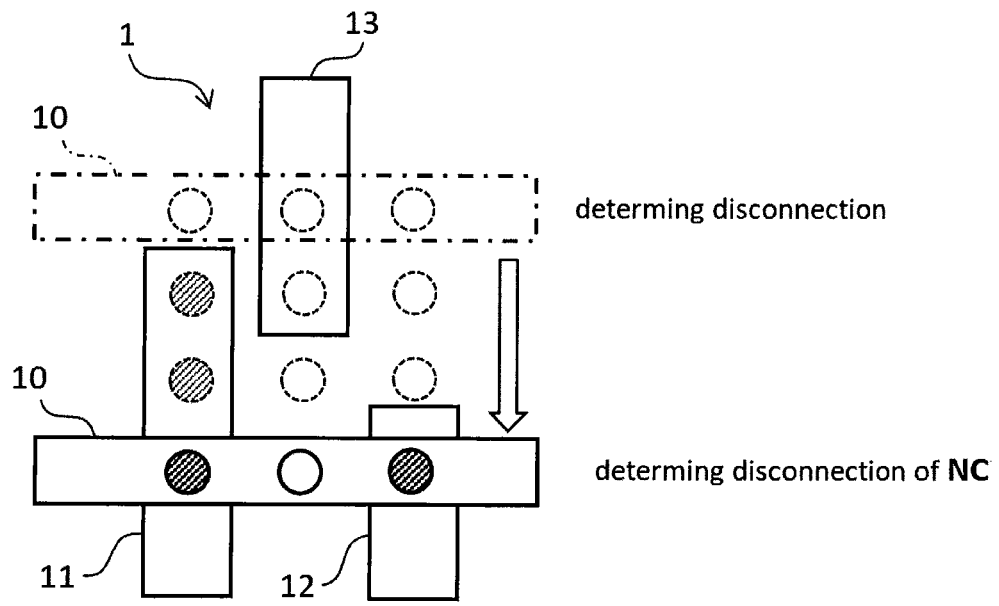
FIG. 2 is a diagram for explaining a method of determining an abnormality occurring in the switch illustrated in FIG. 1.
Figure 3:
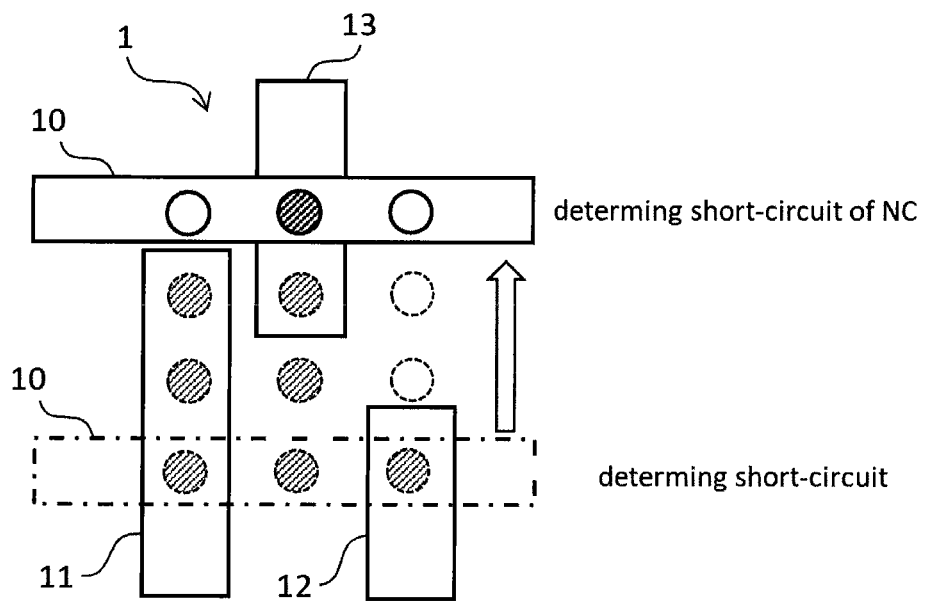
FIG. 3 is a diagram for explaining a method of determining an abnormality occurring in the switch illustrated in FIG. 1.

A method of determining an abnormality occurring in the switch 1 will be described with reference to FIGS. 2 and 3. First, a method of determining disconnection of the NC contact will be described with reference to FIG. 2. As illustrated in FIG. 2, when the movable terminal 10 is at a position indicated by a chain line, it is assumed that all the contacts are in the open state. In this case, the combination of signals input to the ECU18 from the signal lines 14, 15, 16 is OFF, OFF, OFF. However, such a combination is not present in the switch 1 in the normal state. Therefore, it is determined that the off-fixation, that is, the disconnection occurs on some of the contacts.

When the movable terminal 10 moves to the state indicated by a solid line and when both the 1st NO contact and 2nd NO contact are normal, they are closed. Therefore, the signal input from each signal lines 14 and 15 to the ECU18 is switched from OFF to ON. The signal input from the signal line 16 corresponding to the NC contact to the ECU18 is maintained at OFF. When the change in the signals of the signal lines 14 and 15 indicates that both the 1st NO contact and 2nd NO contact are normal, it is found that the abnormality occurs on the NC contact and that the abnormality is a disconnection. In other words, it is confirmed that the NC contact is broken.

Next, a method of determining short-circuit of the NC contact will be described with reference to FIG. 3. As illustrated in FIG. 3, when the movable terminal 10 is at a position indicated by a chain line, it is assumed that all the contacts are in the closed state. In this case, the combination of signals input from the signal lines 14, 15 and 16 to the ECU18 is ON, ON, ON. However, such a combination does not exist in the switch 1 in the normal state. Therefore, it is determined that the on-fixation, that is, a short-circuit occurs on some contact.

When the movable terminal 10 moves to the position indicated by the solid line and when both the 1st and 2nd NO contacts are normal, they are open. Therefore, the signals input from the signal lines 14 and 15 to the ECU18 are switched from ON to OFF. On the other hand, the signal input from the signal line 16 corresponding to the NC contact to the ECU18 is maintained at ON. When the change in the signal of the signal lines 14 and 15 indicates that both the 1st NO contact and 2nd NO contact are normal, it is found that the abnormality occurs on the NC contact and that the abnormality is a short-circuit. That is, it is determined that a short-circuit has occurred on the NC contact.

Figure 4:
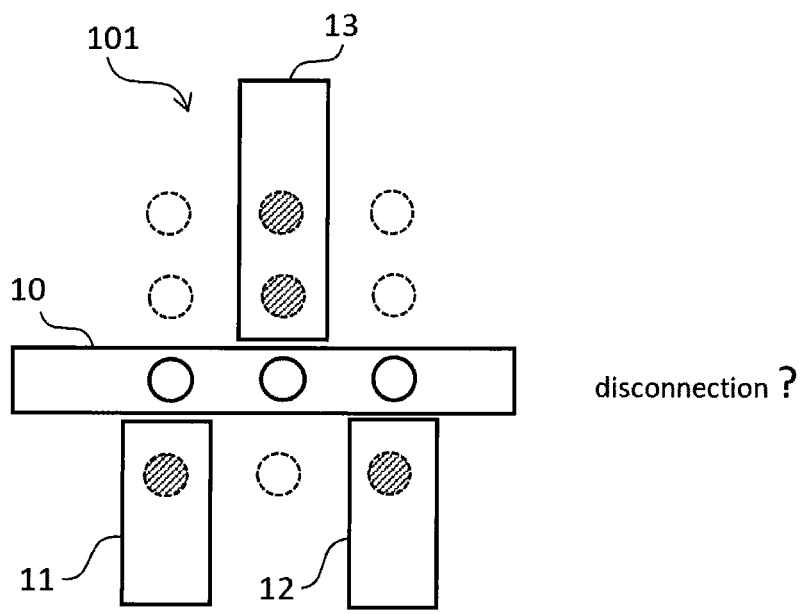
FIG. 4 is a diagram illustrating a comparative example for the switch illustrated in FIG. 1 and a problem thereof.

The abnormality determining method as described above is possible because the switch 1 is configured not to allow all the fixed terminals 11, 12, 13 to contact with the movable terminal 10 at the same time and to allow at least one of the fixed terminals 11, 12, 13 to contact with the movable terminal 10. In a comparative example of a switch 101 illustrated in FIG. 4, a situation in which any fixed terminal 11, 12, 13 does not come into contact with the movable terminal 10 occurs in the course of the sliding of the movable terminal 10. Therefore, even if all signals are OFF, it cannot be immediately determined that disconnection has occurred. In this case, for example, by determining whether a situation in which all the signals are in the OFF state continues for a predetermined time, it may be possibly determined whether disconnection actually occurs. However, if a situation in which an operator moves the movable terminal 10 only a little is continued, it is possibly determined that a disconnection in the switch 101 occurs even though an actual abnormality does not occur.

Figure 5:
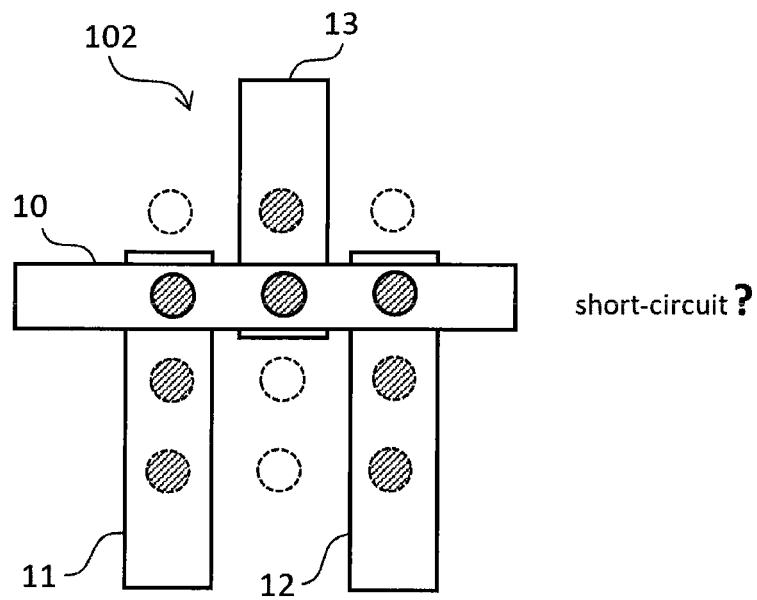
FIG. 5 is a diagram illustrating a comparative example for the switch illustrated in FIG. 1 and a problem thereof.

In a comparative example of a switch 102 illustrated in FIG. 5, a situation in which all of the fixed terminals 11, 12, 13 come into contact with the movable terminal 10 occurs in the course of sliding of the movable terminal 10. In such a switch 102, even if all signals are ON, it cannot be immediately determined that a short-circuit has occurred. In this case, if a situation in which an operator moves the movable terminal 10 only a little is continued, it is possibly determined that a short-circuit in the switch 101 occurs even though the actual abnormality has not occurred.

2. Second Embodiment

Next, a switch according to a second embodiment in the present disclosure will be described with reference to FIGS. 6 to 9. As a schematically configuration illustrated in FIG. 6, the switch 2 of the present embodiment is an opposed contact type switch. A 1st NO terminal 21 and a 2nd NO terminal 22 is disposed to face a ground terminal 26 of which position is fixed. An NC terminal 23 is disposed to face a ground terminal 27 of which position is fixed. However, the direction in which the NC terminal 23 faces the ground terminal 27 is a direction opposite to the direction in which the 1st NO terminal 21 and 2nd NO terminal 22 face the ground terminal 26.

The 1st NO terminal 21 and 2nd NO terminal 22 is disposed between an operating member 20 and the ground terminal 26. The 1st NO terminal 21 is connected to the operating member 20 by a spring 25 having a large spring constant, and is connected to the ground terminal 26 by a spring 24 having a small spring constant. Conversely, the 2nd NO terminal 22 is connected to the operating member 20 by a spring 24 having a small spring constant, and is connected to the ground terminal 26 by a spring 25 having a large spring constant. The NC terminal 23 is disposed between the operating member 20 and a fixed member 28 of which position is fixed. The NC terminal 23 is connected to the operating member 20 by a spring 24 having a small spring constant, and is connected to the fixed member 28 by a spring 25 having a large spring constant.

With no force on the operating member 20, the 1st NO terminal 21 and 2nd NO terminal 22 are away from the ground terminal 26, the NC terminal 23 is in contact with the ground terminal 27. The 1st NO terminal 21 and the ground terminal 26 configure an NO contact (hereinafter, referred to as a "1st NO contact") as a first contact, and the second 2NO terminal 22 and the ground terminal 26 configure an NO contact (hereinafter, referred to as a "2nd NO contact") as a second contact. The NC terminal 23 configures an NC contact as a third contact with the ground terminal 27. That is, the switch 2 is configured as an inverted three-triple switch, similarly to the switch 1 of the first embodiment.

Figure 6:
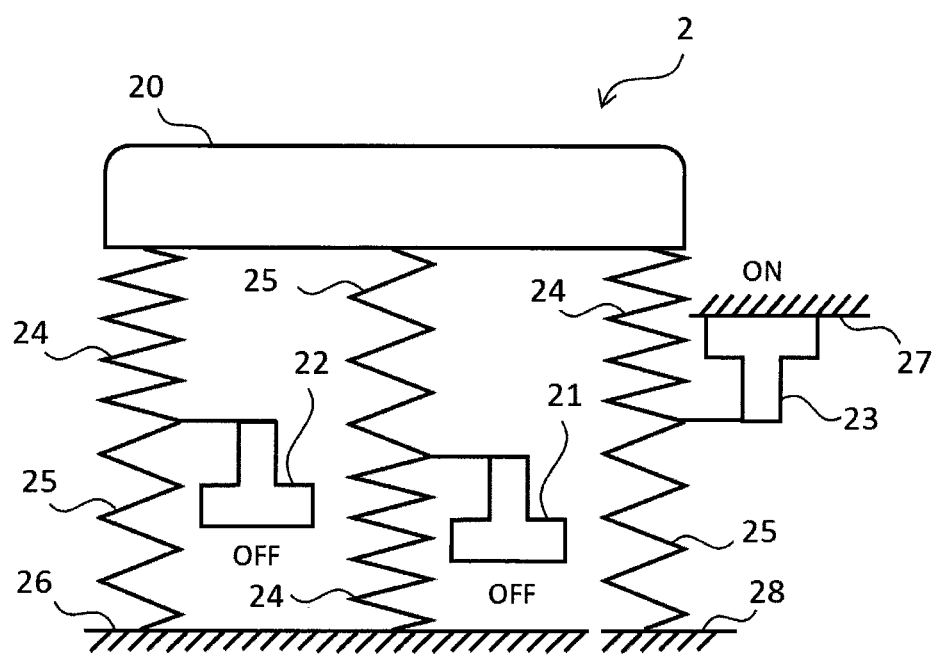
FIG. 6 is a diagram illustrating a schematic configuration of a switch according to a second embodiment in the present disclosure.

A signal line (not illustrated) is connected to each of the 1st NO terminal 21, the 2nd NO terminal 22 and the NC terminal 23. The signal line is connected to an ECU (not illustrated). An OFF signal is output to the ECU from the contact in the open state, and an ON signal is output to the ECU from the contact in the closed state. The ECU determines operation performed on the switch 2 from combination of the signals of each signal line. In a state in which no force is applied to the operating member 20, the operating member 20 is positioned in a first position, as illustrated in FIG. 6. In this condition, the 1st NO contact and the 2nc NO contact are open, and the OFF signals are output from them. The NC contact is closed, from which an ON signal is output. This state is an OFF-state as the first state of the switch 2.

Figure 7:
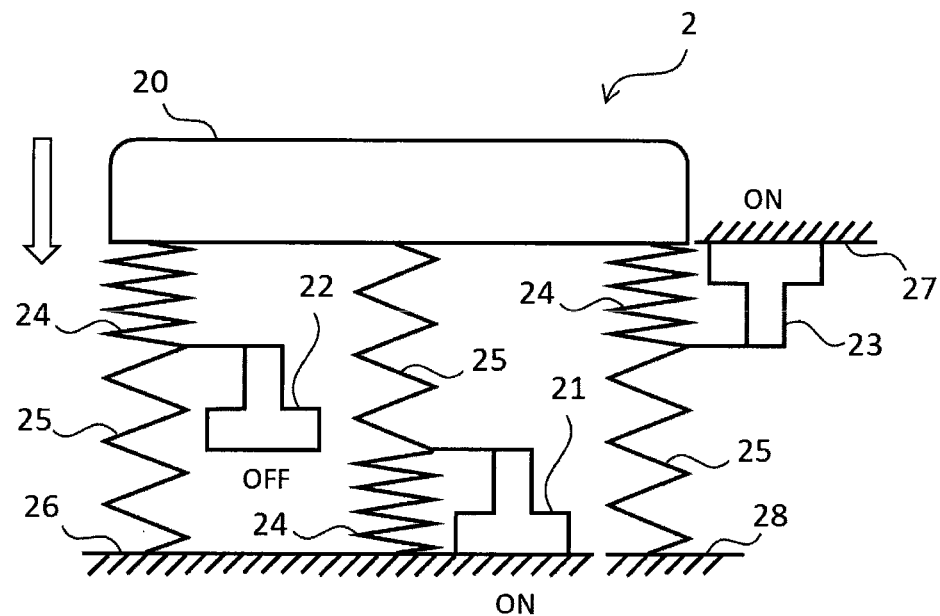
FIG. 7 is a diagram illustrating operation of the switch illustrated in FIG. 6.
Figure 8:
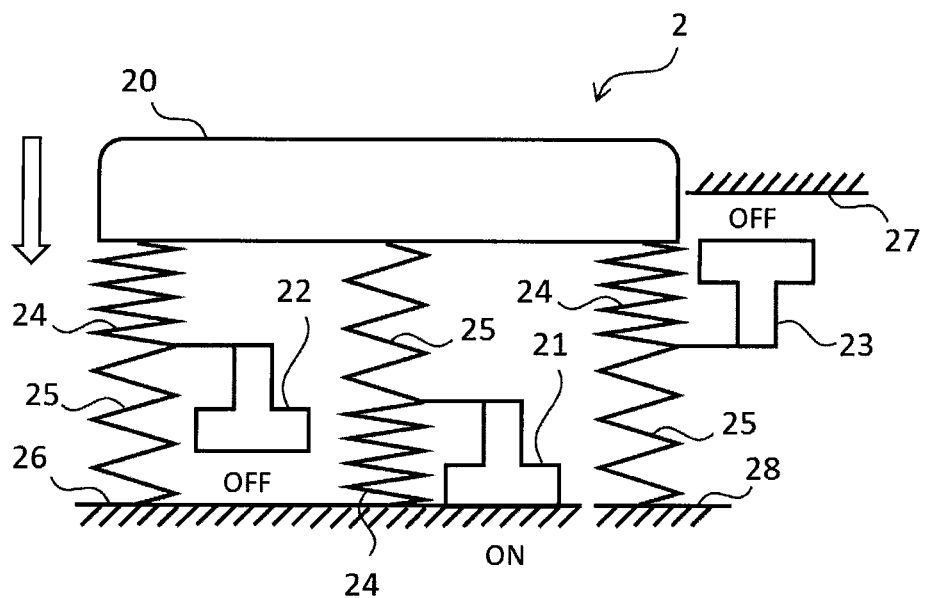
FIG. 8 is a diagram illustrating operation of the switch illustrated in FIG. 6.

In the switch 2 configured as described above, the operating member 20 is pushed down. Then, as illustrated in FIG. 7, the springs 24 having a small spring constant shrink, the 1st NO terminal 21 contacts the ground terminal 26. Thus, the signal output from the 1st NO contact becomes ON signal. Further depressing the operating member 20, as illustrated in FIG. 8, the springs 25 having a large spring constant begin to shrink, the NC terminal 23 is separated from the ground terminal 27. Thus, the signal output from the NC contact becomes the OFF signal.

Figure 9:
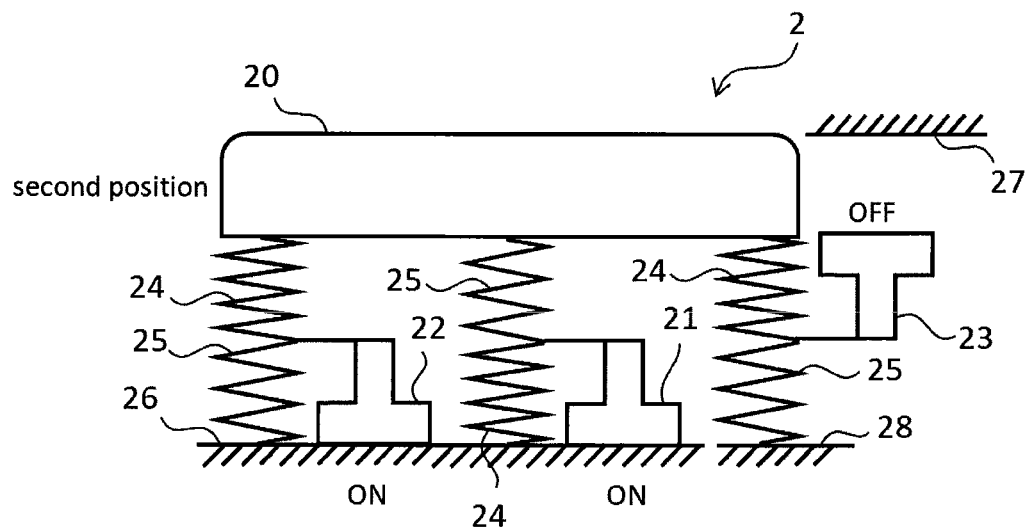
FIG. 9 is a diagram illustrating operation of the switch illustrated FIG. 6.

Then, as the operating member 20 is further depressed, eventually, as illustrated in FIG. 9, the operating member 20 reaches a second position. In the second position, the 2nd NO terminal 22 contacts the ground terminal 26. Thus, the signal output from the 2nd NO contact becomes ON signal. At this time, 1st NO contact and 2nd NO contact are closed and the NC contact is open. This state is an ON-state as a second state of the switch 2. To realize the operation of such a switch 2, the strength and length of each spring 24 and 25 and play in each contact are adjusted. The spring is an example of a member, it may be another elastic member such as rubber.

According to the switch 2 configured as described above, when no abnormality occurs on any of the three contacts and when the operating member 20 is in the first position, the 1st NO contact and the 2nd NO contact are in the open state, and the NC contact is in the closed state. Further, when no abnormality occurs on any of the three contacts and when the operating member 20 is in the second position, the 1st NO contact and the 2nd NO contact are in the closed state, and the NC contact is in the open state. Then, when no abnormality occurs on any of the three contacts, in the curse of displacing the operating member 20 from the first position to the second position, not all of the contacts are in the open state, and also, not all of the contacts are in the closed state.

That is, according to the configuration of the switch 2, all of the 1st NO contact, the 2nd NO contact and the NC contact are in the open state only when an abnormality occurs in the switch 2. Similarly, all of these contacts are in the closed state only when an abnormality occurs in the switch 2. According to the switch 2 configured as described above, since all the contacts are not in the same state if they are normal, it may be possible to physically suppress erroneous detection of an abnormality. The abnormality determining method of the switch described in the first embodiment may also be applied to the switch 2.

3. Third Embodiment

Next, a switch according to a third embodiment in the present disclosure will be described with reference to FIGS. 10 to 13. As a schematically configuration illustrated in FIG. 10, the switch 3 of the present embodiment is a mixed type switch having two sliding contacts and one opposing contact.

The switch 3 is provided with two NO terminals 31 and 32 of which positions are fixed and one movable terminal 30 which is connected to ground. Each NO terminal 31 and 32 configures a sliding contact together with the movable terminal 30. The switch 3 is provided with a ground terminal 37 and a NC terminal 33 of which position is fixed. The NC terminal 33 configures a opposing contact together with the ground terminal 37. The NC terminal 33 is disposed between the movable terminal 30 which is an operating member and a fixed member 36. The NC terminal 33 is connected to the movable terminal 30 by a spring 34 which has a small spring constant and to the fixed member 36 by a spring 35 which has large spring constant. Each NO terminal 31 and 32 configures a NO contact together with the movable terminal 30. NC terminal 33 configures an NC contact together with the ground terminal 37. That is, the switch 3 is configured as an inverted three-triple-system switch, similarly to the switch 1 of the first embodiment and the switch 2 of the second embodiment.

Figure 10:
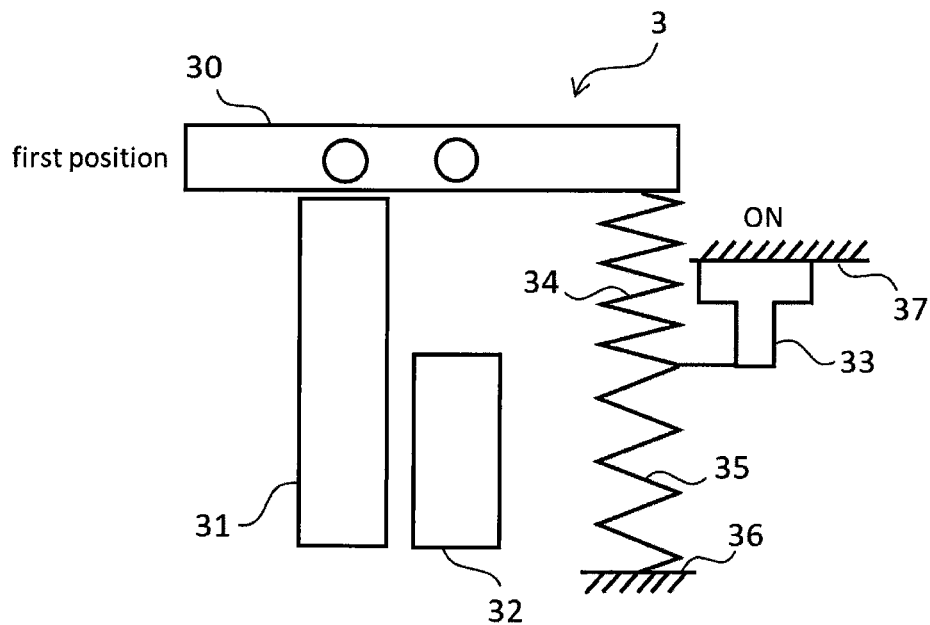
FIG. 10 is a diagram illustrating a schematic configuration of a switch according to a third embodiment in the present disclosure.

Each of the 1st NO terminal 31, 2nd NO terminal 32 and the NC terminal 33 is connected to a signal line (not illustrated). The signal line is connected to an ECU (not illustrated). An OFF-signal is output to the ECU from the contact in the open state, and an ON-signal is output to the ECU from the contact in the closed state. The ECU determines the operation performed on the switch 3 from combination of the signals of each signal line. As illustrated in FIG. 10, in a state where no force is applied to the movable terminal 30 which is the operating member, the movable terminal 30 is located in a first position. In this state, 1st NO contact and 2nd NO contact are open, and the OFF-signals are outputted from them. White circles illustrated in FIG. 10 denote states in which the contact are open. In the state of FIG. 10, the NC contact is closed, from which the ON-signal is output. This state is an OFF-state as a first state of the switch 3.

Figure 11:
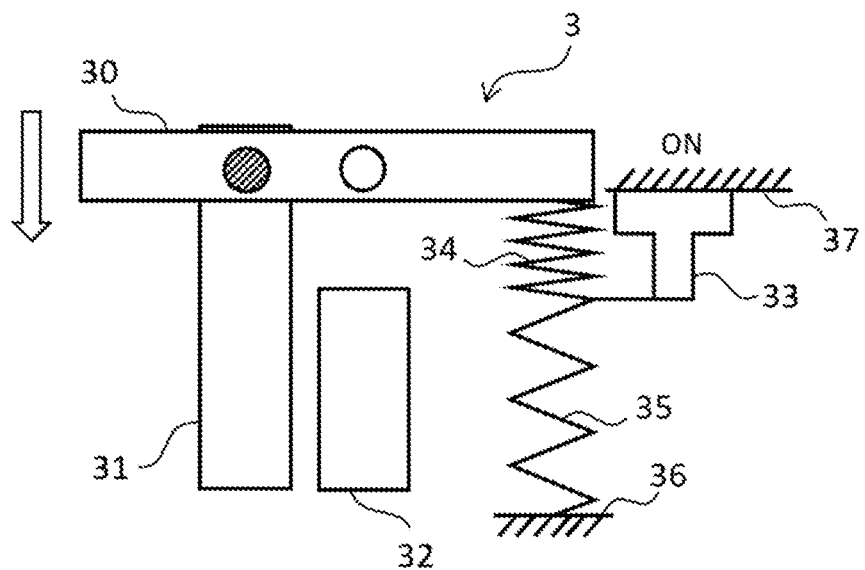
FIG. 11 is a diagram illustrating operation of the switch illustrated in FIG. 10.
Figure 12:
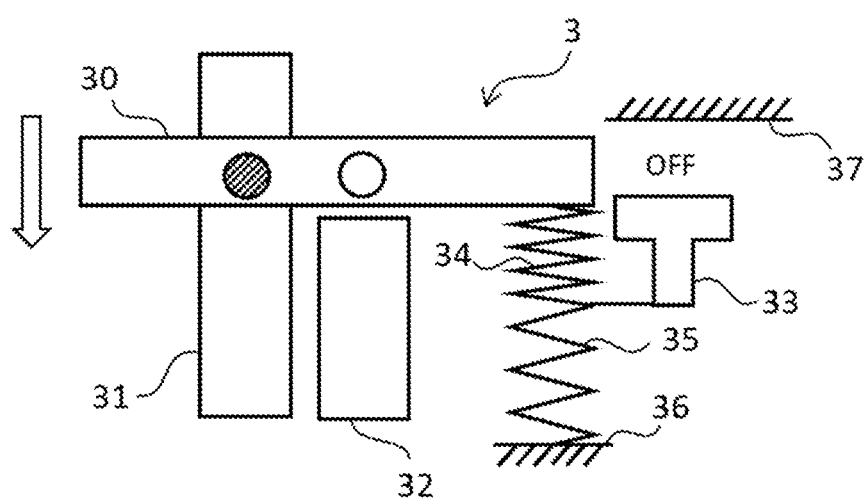
FIG. 12 is a diagram illustrating operation of the switch illustrated in FIG. 10.

In the switch 3 configured as described above, the movable terminal 30 is slid in a direction to shrink the springs 34 and 35. As illustrated in FIG. 11, first, the movable terminal 30 contacts with the 1st NO terminal 31. Thus, the NC contact and 1st NO contact are closed and only the 2nd NO contact is open. A black circle illustrated in FIG. 11 denotes a state in which the contact is open. In this state, the spring 34 having a small spring constant has begun to shrink, the NC terminal 33 remains in contact with the ground terminal 37. As the movable terminal 30 is further slid, as illustrated in FIG. 12, the spring 35 having a large spring constant begins to shrink, the NC terminal 33 is separated from the ground terminal 37. Thus, the signal output from the NC contact becomes the OFF-signal.

Figure 13:
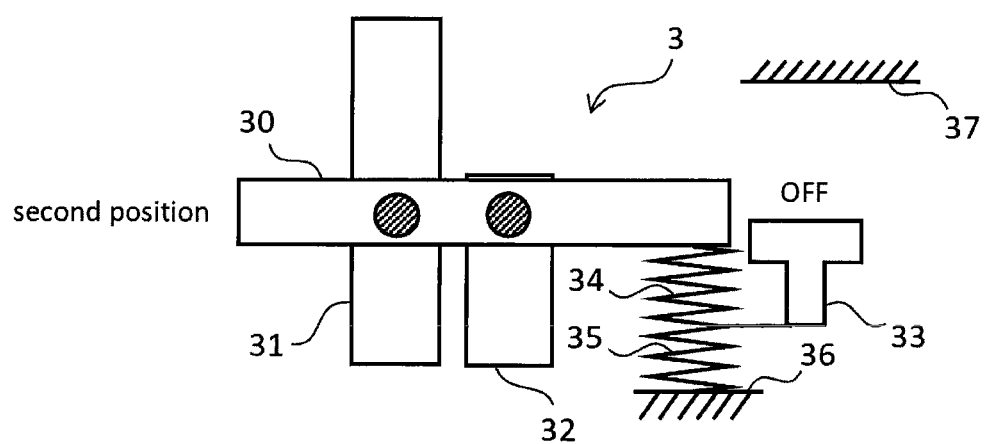
FIG. 13 is a diagram illustrating operation of the switch illustrated in FIG. 10.

Then, when further sliding the movable terminal 30, eventually, as illustrated in FIG. 13, the movable terminal 30 reaches a second position. In the second position, the movable terminal 30 contacts the 2nd NO terminal 32. Thus, the signal output from the 2nd NO contact becomes the ON-signal. At this time, 1st NO contact and 2nd NO contact are closed and the NC contact is open. This state is an ON-state as a second state of the switch 3.

According to the switch 2 configured as described above, when no abnormality occurs on any of the three contacts and when the operating member 30 is in the first position, the 1st NO contact and 2nd NO contact are in the open state, and the NC contact is in the closed state. Further, when no abnormality occurs on any of the three contacts and when the operating member 30 is in the second position, the 1st NO contact and 2nd NO contact are in the closed state, and the NC contact is in the open state. Then, if no abnormality occurs on any of the three contacts, in the course of displacing the operating member 30 from the first position to the second position, not all of the contacts are in the open state, also, not all of the contacts are in the closed state.

That is, according to the configuration of the switch 3, all of the 1st NO contact, the 2nd NO contact and the NC contact are in the open state only when an abnormality occurs in the switch 3. Similarly, all of these contacts are in the closed state only when an abnormality occurs in the switch 3. According to the switch 3 configured as described above, since all the contacts are not in the same state if they are normal, it may be possible to physically suppress erroneous detection of an abnormality. The abnormality determining method of the switch described in the first embodiment may also be applied to the switch 3.

4. Determination Flow of Abnormality Determination

Hereinafter, a determination flow of abnormality determination applied to the switch according to each of the above embodiments will be described with reference to flowcharts of FIGS. 14 to 22. Here, the switch is assumed to be a shift switch of a vehicle.

Figure 14:
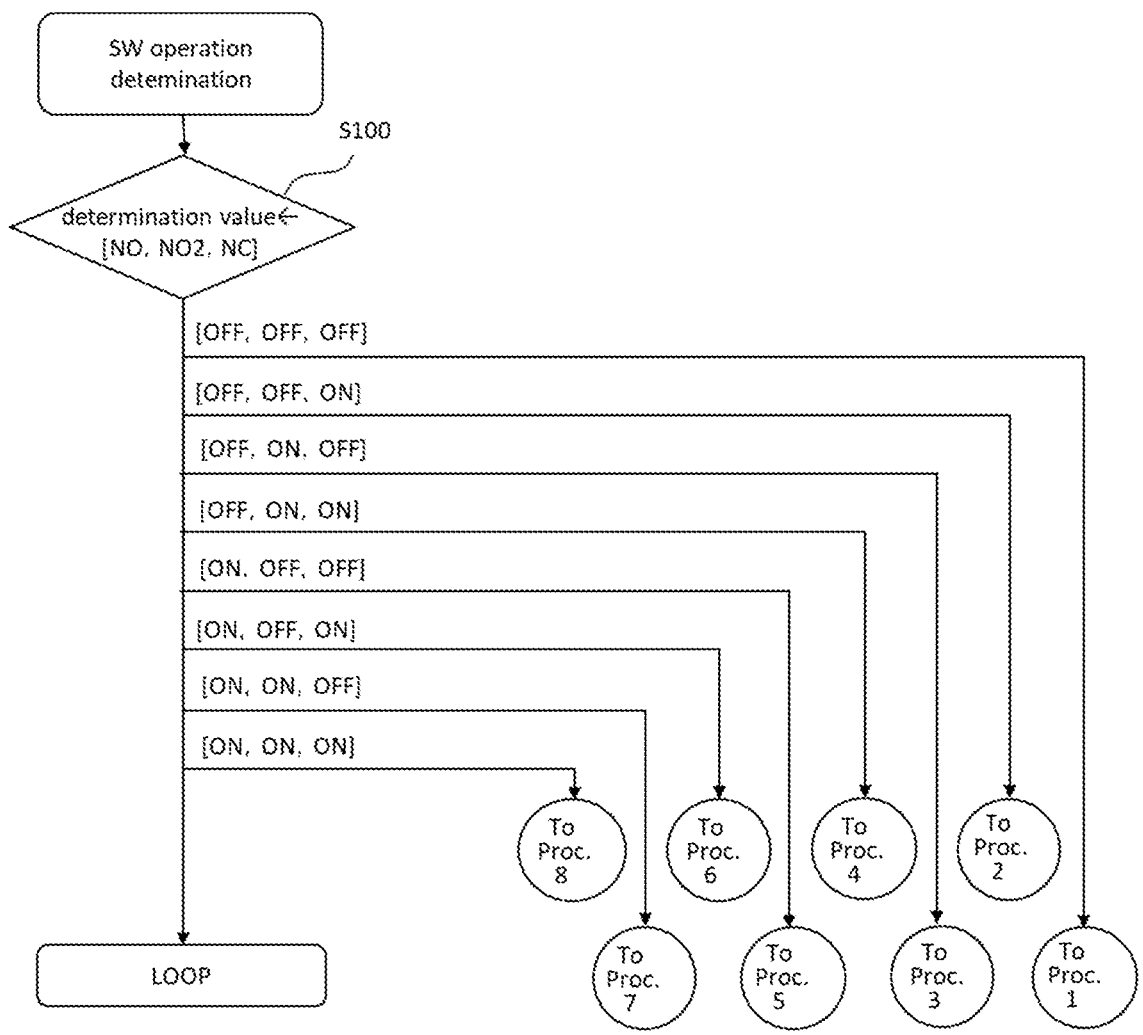
FIG. 14 is a flowchart illustrating a determination flow of abnormality determination applied to the switch according to each embodiment in the present disclosure.

In step S100 of the determination flow illustrated in FIG. 14, NO1 which is a signal from the 1st NO contact, NO2 which is a signal from the 2nd NO contact, and NC which is a signal from the NC contact are taken into the ECU as determination values. It is determined whether NO1, NO2 and NC is ON or OFF. Process 1 is executed when a condition in which NO1, NO2, and NC are OFF continues for a predetermined time. When a condition in which NO1, NO2, and NC are respectively OFF, OFF, and ON continues for the predetermined time, process 2 is executed. When a condition in which NO1, NO2 and NC are respectively OFF, ON, and OFF continues for the predetermined time, process 3 is executed. When a condition in which NO1, NO2 and NC are respectively OFF, ON, and ON continues for the predetermined time, process 4 is executed. When a condition in which NO1, NO2 and NC are respectively ON, OFF, and OFF continues for the predetermined time, process 5 is executed. When a condition in which NO1, NO2 and NC are respectively ON, OFF, and ON continues for the predetermined time, process 6 is executed. When a condition in which NO1, NO2 and NC are respectively ON, ON, and OFF continues for a predetermined time, process 7 is executed. When a condition in which NO1, NO2 and NC are respectively ON, ON, and ON continues for the predetermined time, process 8 is executed. Until any of the above-mentioned conditions continues for the predetermined time, the process returns to the start of the determination flow, and the determination in step S100 is repeated.

Figure 15:
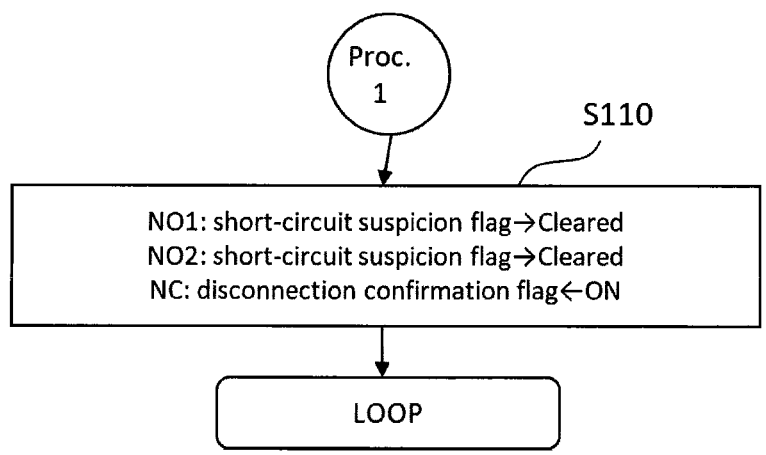
FIG. 15 is a sub-flowchart illustrating a process 1 of the determination flow illustrated in FIG. 14.

In the process 1 illustrated in FIG. 15, in step S110, a short-circuit suspicion flag for each of NO1 and NO2 is cleared, and a disconnection definite flag for NC is turned on. The suspicion flag is a flag set on the contact which outputs a signal inconsistent with the other two signals among NO1, NO2, and NC. That is, the suspicion flag is set on the contact suspected of occurring an abnormality. When the disconnection is suspected, a disconnection suspicion flag is turned on. When a short-circuit is suspected, the short-circuit suspicion flag is turned on. The definite flag is a flag set on the contact at which an abnormality is certainly occurring. When it is ensured that the disconnection has occurred, the disconnection definite flag is turned on. When it is ensured that the short-circuit has occurred, the short-circuit definite flag is turned on. According to the configuration of the switches according to the above-described embodiments, when all of NO1, NO2 and NC are OFF, it is ensured that the disconnection occurs on any of the contacts, and therefore, the disconnection definite flag is turned on. On the other hand, since both NO1 and NO2 are OFF, they are not at least short-circuited. Therefore, the short-circuit suspicion flags for NO1 and NO2 are cleared.

Figure 16:
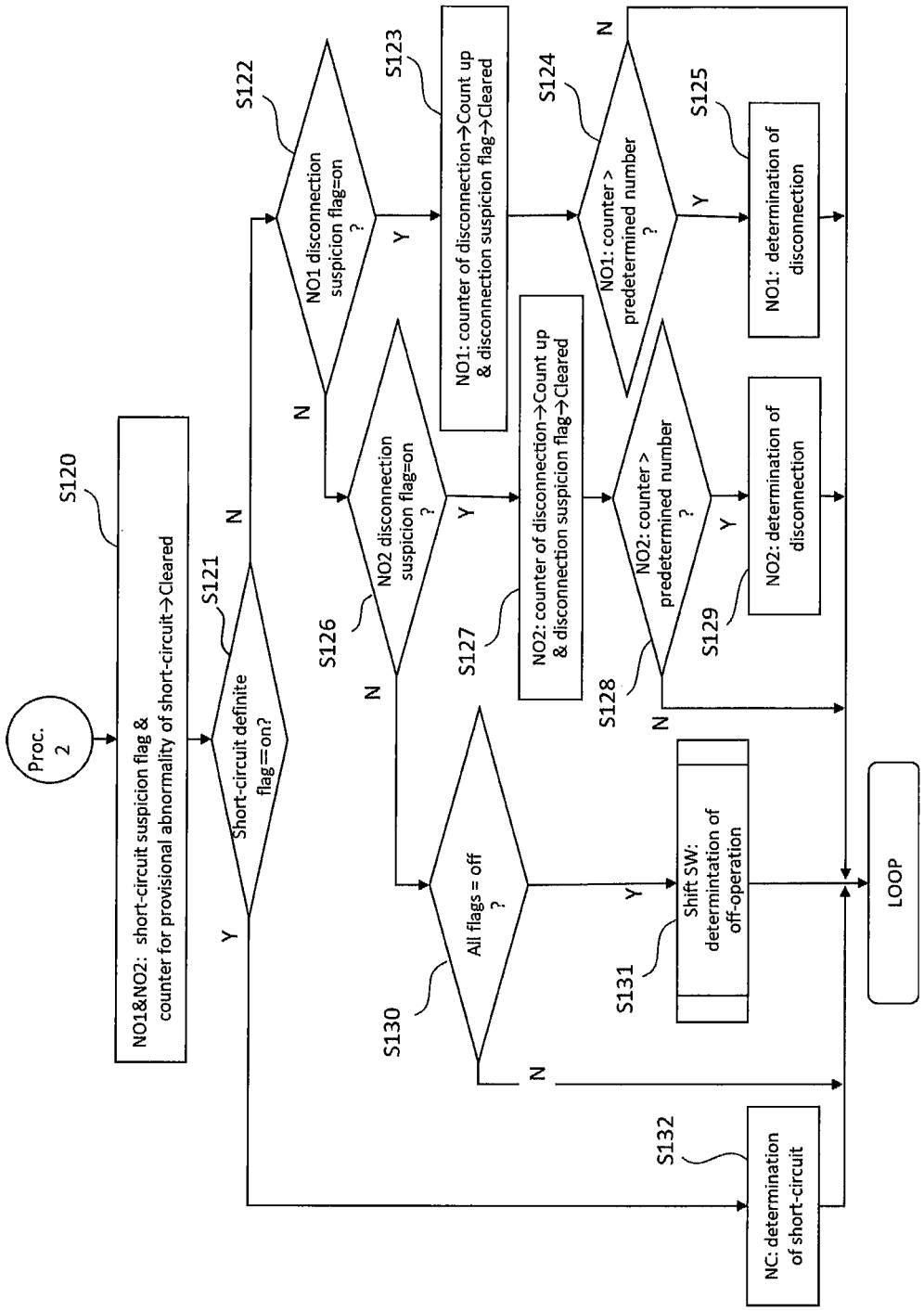
FIG. 16 is a sub-flowchart illustrating a process 2 of the determination flow illustrated in FIG. 14.

In the process 2 illustrated in FIG. 16, the short-circuit suspicion flags for NO1 and NO2 are cleared in step S120. Further, each of provisional abnormality counters of short-circuit for each of NO1 and NO2 are cleared. When NO1, NO2 and NC are respectively OFF, OFF and ON, the relationships between the outputs are consistent. Therefore, NO1 and NO2 are not at least short-circuited.

Next, in step S121, it is determined whether or not the short-circuit definite flag is turned on. When the short-circuit definite flag is off, in step S122, it is determined whether the disconnection suspicion flag for NO1 is turned on. When NO1, NO2, and NC are respectively OFF, OFF and ON at the present time, and when the disconnection suspicion flag for NO1 was turned on the last time, it is likely that 1st NO contact is disconnected. That is, it is likely that only NO1 is inconsistent with the other outputs because the 1st NO contact is disconnected. In this case, in step S123, the provisional abnormality counter of disconnection for NO1 is counted up, and the disconnection suspicion flag for NO1 is cleared.

Next, in step S124, it is determined whether or not the provisional abnormality counter of disconnection for NO1 is a predetermined number or more. The predetermined number is, for example, 2 times. When the provisional abnormality counter of disconnection for NO1 becomes the predetermined number or more, it is determined in step S125 that a disconnection has occurred on the 1st NO contact corresponding to NO1.

When it is determined in step S122 that the disconnection suspicion flag for NO1 is off, then in step S126 it is determined whether or not the disconnection suspicion flag for NO2 is on. When NO1, NO2, and NC are respectively OFF, OFF, ON at the present time, and when the disconnection suspicion flag for NO2 was turned on the last time, it is likely that 2nd NO contact is disconnected. That is, it is likely that only NO2 was inconsistent with the other outputs because the 2nd NO contact is disconnected. In this case, in step S127, the provisional abnormality counter of disconnection for NO2 is counted up, and the disconnection suspicion flag for NO2 is cleared.

Next, in step S128, it is determined whether or not the provisional abnormality counter of disconnection for NO2 is a predetermined number or more. The predetermined number is, for example, 2 times. When the provisional abnormality counter of disconnection for NO2 becomes the predetermined number or more, it is determined in step S129 that a disconnection has occurred on the 2nd NO contact corresponding to NO2.

When it is determined, in step S122, that the disconnection suspicion flag for NO1 is off and determined, in step S126, that the disconnection suspicion flag for NO2 is turned off, it is determined whether all the flags indicating the possibility of abnormalities are off. When all the flags are off, it is possibly determined that there is no abnormality in any of the contacts. In this case, the determination flow proceeds to step S131, and it is determined that the off-operation has been performed on the shift switch.

In step S121, when the short-circuit definite flag is on, it is determined in step S132 that a short-circuit has occurred on the NC contact corresponding to NC. More specifically, it is determined that an abnormality of short-circuit has occurred only on the NC contact among the three contacts. If both the 1st NO and 2nd contacts are found to be normal in situations where it is certain that a short-circuit occurs, the contact on which the short-circuit occurs is obviously the NC contact.

Figure 17:
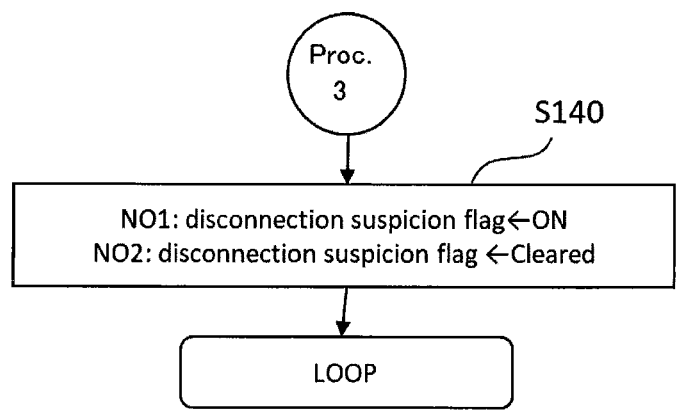
FIG. 17 is a sub-flowchart illustrating a process 3 of the determination flow illustrated in FIG. 14.

In the process 3 illustrated in FIG. 17, in step S140, the flag is set when NO1, NO2 and NC are respectively OFF, ON and OFF at the present time. In this case, there is no inconsistency among NO2 and NC, but NO1 is inconsistent with the other two outputs. Since NO1 is OFF, the signal line corresponding to NO1 is suspected to be disconnected. Therefore, the disconnection suspicion flag for NO1 is turned on. Since NO2 is ON, the signal line corresponding to NO2 is not at least disconnected. Therefore, the disconnection suspicion flag for NO2 is cleared.

Figure 18:
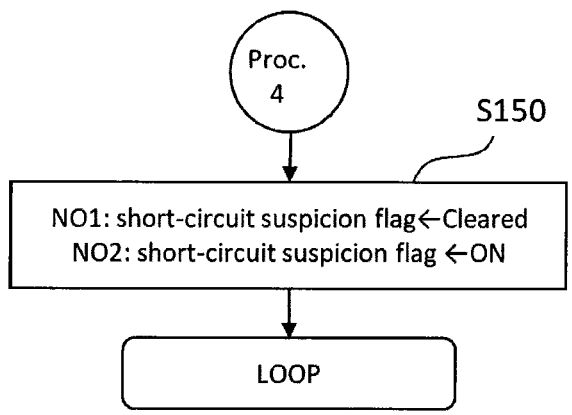
FIG. 18 is a sub-flowchart illustrating a process 4 of the determination flow illustrated in FIG. 14.

In the process 4 illustrated in FIG. 18, in step S150, the flag is set when NO1, NO2 and NC are respectively OFF, ON and ON at the present time. There is no inconsistency among NO1 and NC, but NO2 is inconsistent with the other two outputs. Since NO2 is ON, the signal line corresponding to NO2 is suspected of being short-circuited. Therefore, the short-circuit suspicion flag for NO2 is turned on. Since NO1 is OFF, the signal line corresponding to NO1 is not at least short-circuited. Therefore, the short-circuit suspicion flag for NO1 is cleared.

Figure 19:
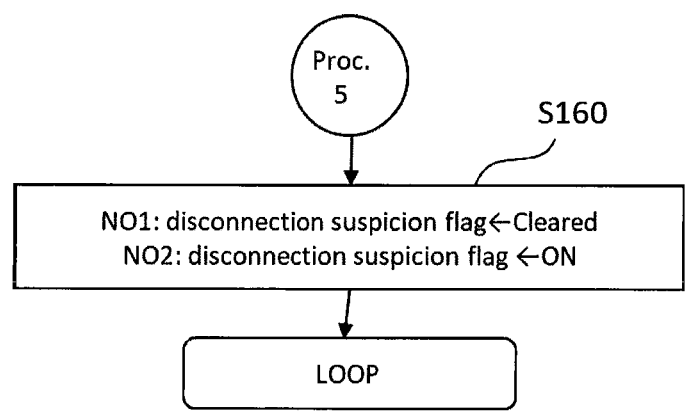
FIG. 19 is a sub-flowchart illustrating a process 5 of the determination flow illustrated in FIG. 14.

In the process 5 illustrated in FIG. 19, in step S160, the flag is set when NO1, NO2 and NC are respectively ON, OFF and OFF at the present time. There is no inconsistency among NO1 and NC, but NO2 is inconsistent with the other two outputs. Since NO2 is OFF, the signal line corresponding to NO2 is suspected to be disconnected. Therefore, the disconnection suspicion flag for NO2 is turned on. Since NO1 is ON, at least a disconnection on the signal line corresponding to NO1 does not occur. Therefore, the disconnection suspicion flag for NO1 is cleared.

Figure 20:
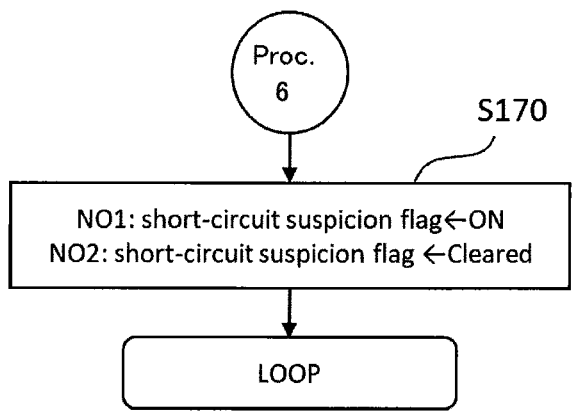
FIG. 20 is a sub-flowchart illustrating a process 6 of the determination flow illustrated in FIG. 14.

In the process 6 illustrated in FIG. 20, in step S170, the flag is set when NO1, NO2 and NC are respectively ON, OFF, and ON at the present time. In this case, there is no inconsistency among NO2 and NC, but NO1 is inconsistent with the other two outputs. Since NO1 is on, the signal line corresponding to NO1 is suspected of being short-circuited. Therefore, the short-circuit suspicion flag for NO1 is turned on. Since NO1 is OFF, the signal line corresponding to NO1 is not at least short-circuited. Therefore, the short-circuit suspicion flag for NO2 is cleared.

Figure 21:
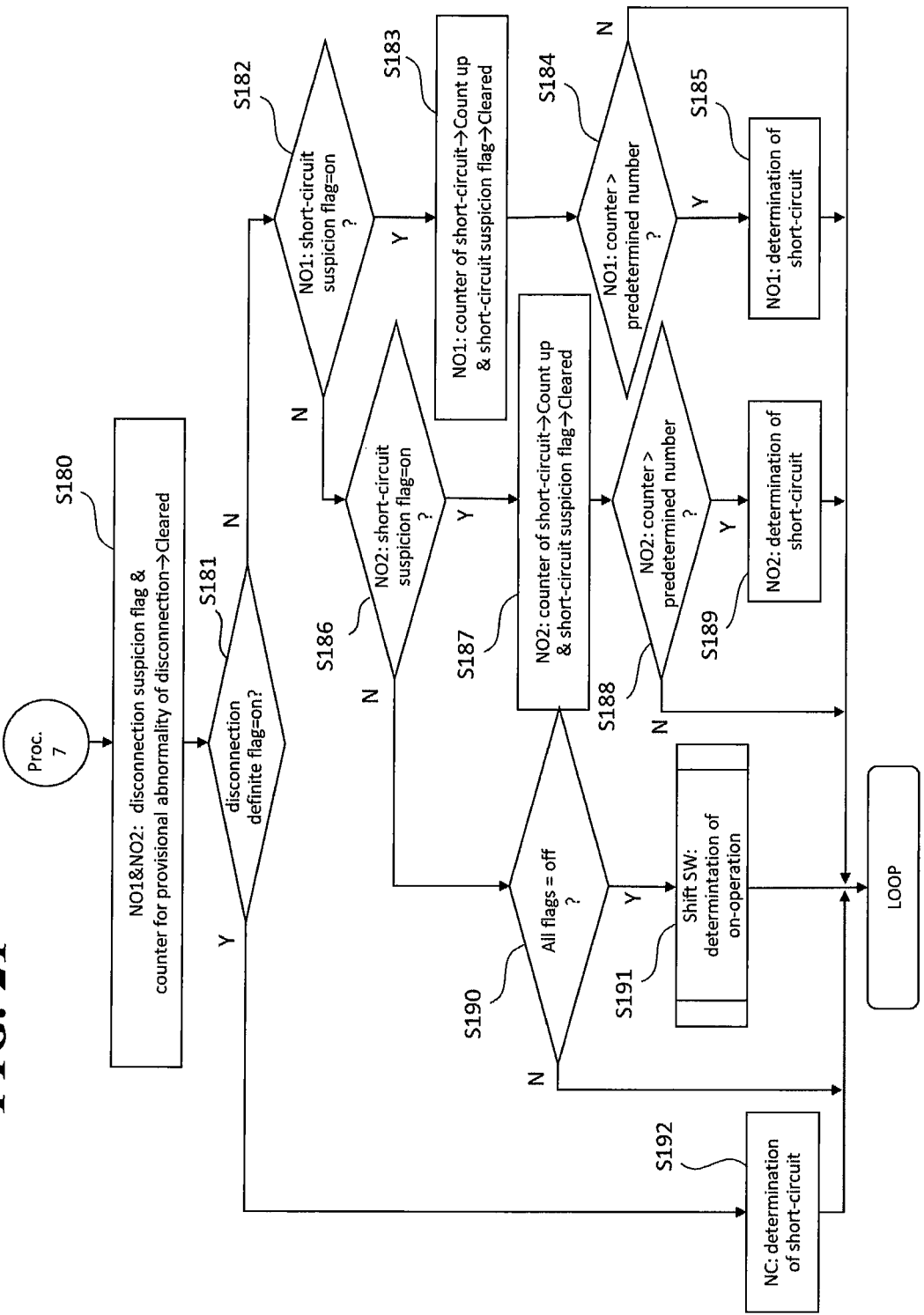
FIG. 21 is a sub-flowchart illustrating a process 7 of the determination flow illustrated in FIG. 14.

In the process 7 illustrated in FIG. 21, in step S180, the disconnection suspicion flags for NO1 and NO2 are cleared, respectively. In addition, each of the provisional abnormality counters of disconnection for NO1 and NO2 is cleared. When NO1, NO2 and NC are respectively ON, ON and OFF, the relationships between the outputs are consistent. Therefore, there is at least no doubt about the disconnection of NO1 and NO2.

Next, in step S181, it is determined whether or not the disconnection definite flag is on. When the disconnection definite flag is off, in step S182, it is determined whether or not the short-circuit suspicion flag for NO1 is on. When NO1, NO2 and NC are respectively ON, ON and OFF at the present time, and when the short-circuit suspicion flag for NO1 was turned on the last time, it is likely that the 1st NO contact is short-circuited. That is, it is likely that only NO1 is inconsistent with the other outputs since the 1st NO contact is short-circuited. In this case, in step S183, the provisional abnormality counters of short-circuit for NO1 is counted up, and the short-circuit suspect flag for NO1 is cleared.

Next, in step S184, it is determined whether or not the provisional abnormality counters of short-circuit for NO1 is equal to or more than a predetermined number. The predetermined number is, for example, 2 times. When the provisional abnormality counters of the short-circuit for NO1 becomes a predetermined number or more, it is determined in step S185 that a short-circuit has occurred in the signaling line corresponding to NO1.

In step S182, when it is determined the short-circuit suspicion flag for NO1 is off, then in step S186, it is determined whether or not the short-circuit suspicion flag for NO2 is on. When NO1, NO2 and NC are respectively ON, ON and OFF at the present time, and when the short-circuit suspicion flag for NO2 was turned on the last time, it is likely that the 2nd NO contact is short-circuited. That is, it is likely that only NO2 is inconsistent with other outputs since the 2nd NO contact is short-circuited. In this case, in step S187, the provisional abnormality counters of short-circuit for NO2 is counted up, and the short-circuit suspicion flag for NO2 is cleared.

Next, in step S188, it is determined whether or not the provisional abnormality counters of short-circuit for NO2 is equal to or more than a predetermined number. The predetermined number is, for example, 2 times. When the provisional abnormality counters of short-circuit for NO2 becomes a predetermined number or more, it is determined in step S189 that a short-circuit has occurred on the signaling line corresponding to NO2.

When it is determined that the short-circuit suspicion flag for NO1 is off in step S182, and further, when it is determined in step S186 that the short-circuit suspicion flag for NO2 is off, it is determined in step 190 whether or not all the flags indicating the possibility of abnormalities are off. When all the flags are off, it is possibly determined that there is no abnormality in any of the contacts. In this instance, the determination flow proceeds to step S191, and it is determined that the on-operation has been performed on the shift switch.

In step S181, when the disconnection definite flag is on, it is determined in step S192 that disconnection has occurred on the NC contact corresponding to the NC. More specifically, it is determined that an abnormality of disconnection has occurred only on the NC contact among the three contacts. If both the 1st NO and 2nd NO contacts are found to be normal in situations where it is certain that a disconnection occurs, the contact in which the disconnection occurs is obviously the NC contact.

Figure 22:
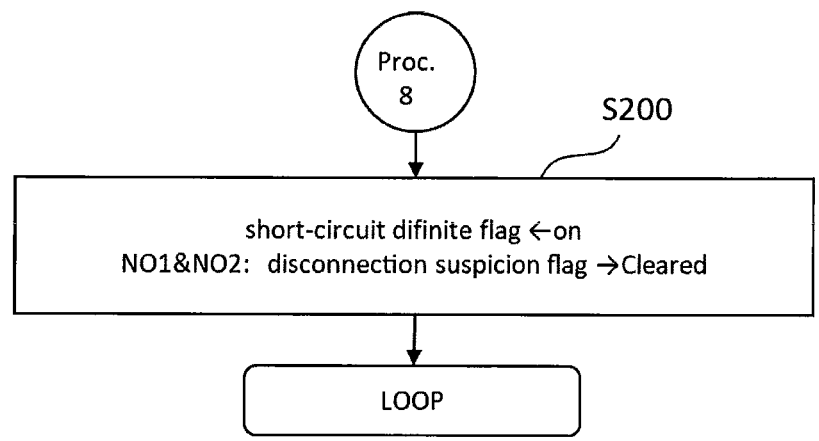
FIG. 22 is a sub-flowchart illustrating a process 1 of the determination flow illustrated in FIG. 14.

In the process 8 illustrated in FIG. 22, in step S200, the flag is set when NO1, NO2 and NC are ON at the present time. According to the configuration of the switches according to the above-described embodiments, when all of NO1, NO2 and NCs are on, it is ensured that a short-circuit has occurred on any of the contacts, and therefore, the short-circuit definite flag is turned on. Since both NO1 and NO2 are on, the signal lines corresponding to NO1 and NO2 are not disconnected. Therefore, the disconnection suspicion flags for NO1 and NO2 are cleared.

5. Other

The switch according to each embodiment is a switch of an inversion three triple system having two NO contacts and one NC contact. However, the each embodiment is also applicable to an inversion three triple system switch having one NO contact and two NC contacts. In the third embodiment, the mixture type switch has two sliding contacts and one opposing contact, but the embodiment is also applicable to a mixed type switch having one sliding contact and two opposing contacts.

What is claimed is:

1. An abnormality determining method for determining an abnormality occurring in a switch comprising:
    an operating member which displaces between a first position and a second position; and
    three contacts of which state is switched between a first state in which a signal line is connected or disconnected and a second state in which the signal line is reversed from the first state due to displacement of the operating member between the first position and the second position; wherein
    the three contacts includes:
        a first contact switched from the first state to the second state in the course of the displacement of the operating member from the first position to the second position;
        a second contact switched, in the course of the displacement of the operating member from the first position to the second position, from the first state to the second state at a timing later than a timing of the switching of the first contact; and
        a third contact switched, in the course of the displacement of the operating member from the first position to the second position, from the second state to the first state at a timing later than the switching of the first contact and earlier than the switching of the second contact, the method of determining an abnormality comprising:
    determining that an abnormality fixed to the first state occurs in the third contact
    in state that all of a first signal output from the first contact, a second signal output from the second contact, and a third signal output from the third contact are signals corresponding to the first state,
    when the first signal and the second signal are switched to signals corresponding to the second state and only the third signal remains the signal corresponding to the first state.

2. An abnormality determining method for determining an abnormality occurring in a switch comprising:
    an operating member which displaces between a first position and a second position; and
    three contacts of which state is switched between a first state in which a signal line is connected or disconnected and a second state in which the signal line is reversed from the first state due to displacement of the operating member between the first position and the second position; wherein
    the three contacts includes:
        a first contact switched from the first state to the second state in the course of the displacement of the operating member from the first position to the second position;
        a second contact switched, in the course of the displacement of the operating member from the first position to the second position, from the first state to the second state at a timing later than a timing of the switching of the first contact; and
        a third contact switched, in the course of the displacement of the operating member from the first position to the second position, from the second state to the first state at a timing later than the switching of the first contact and earlier than the switching of the second contact, the method of determining an abnormality comprising:
    determining that an abnormality fixed to the second state occurs in the third contact
    in state that all of a first signal output from the first contact, a second signal output from the second contact, and a third signal output from the third contact are signals corresponding to the second state,
    when the first signal and the second signal are switched to a signal corresponding to the first state and only the third signal remains the signal corresponding to the second state.

* * * * *